United States Patent [19]

Hareyama

[11] Patent Number: 4,963,838
[45] Date of Patent: Oct. 16, 1990

[54] FREQUENCY SYNTHESIZER

[75] Inventor: Nobuo Hareyama, Kanagawa, Japan

[73] Assignee: Sony Corporation, Tokyo, Japan

[21] Appl. No.: 455,186

[22] Filed: Dec. 22, 1989

[30] Foreign Application Priority Data

Jan. 13, 1989 [JP] Japan .................................. 1-007366

[51] Int. Cl.⁵ ............................................. H03L 7/16
[52] U.S. Cl. ......................................... 331/2; 331/16;
331/25; 455/260
[58] Field of Search ................... 331/2, 14, 16, 18, 25;
375/120; 455/260

[56] References Cited

U.S. PATENT DOCUMENTS 4,305,045 12/1981 Metz et al. ........................ 331/2 X Primary Examiner—David Mis
Attorney, Agent, or Firm—Alvin Sinderbrand

[57] ABSTRACT

A frequency synthesizer having first and second PLLs coupled by a mixer to provide an output signal which changes in predetermined frequency steps or increments is capable of operation in a first frequency change mode in which frequencies of output signals from the first and second PLLS change in the same direction or in a second frequency change mode in which the frequencies of the output signals from the first and second PLLs change in opposite directions, and the first or second frequency change mode is selected on the basis of a dividing ratio employed in one of the first and second PLLs.

14 Claims, 4 Drawing Sheets

FREQUENCY SYNTHESIZER

BACKGROUND OF THE INVENTION

1. Field of the Invention

The present invention relates to a frequency synthesizer and, more particularly, is directed to a high resolution frequency synthesizer of a type having double phase-locked loops (PLLs).

2. Description of the Prior Art

A high resolution frequency synthesizer can be constructed even with a single PLL (phase locked loop). However, when the minimum increment of the change in frequency or the frequency step $\Delta f$ is, for instance, about 10 Hz, the frequency dividing ratio increases and the carrier to noise ratio C/N deteriorates. Therefore, in many cases, a frequency synthesizer is constructed with two PLLs or double loops, for example, as shown in FIG. 1, at 51 and 59, respectively.

In the frequency synthesizer of FIG. 1, a signal Sr1 having a first reference frequency fr1 is supplied to one input of a phase comparator 53 of the first PLL 51 through a terminal 52. A signal from a frequency divider 54 having a frequency dividing ratio of N1 is supplied to another input of the phase comparator 53. The phases of the signal Sr1 and of the signal from the frequency divider 54 are compared by the phase comparator 53 which provides an error voltage Ver1 proportional to the frequency and/or phase differences therebetween. The error voltage Ver1 is supplied to a VCO (voltage controlled oscillator) 56 through a low-pass filter 55. An output signal Sv1 having a frequency fv1 is obtained from the VCO 56, and is supplied to a terminal 57 and to a mixer 58.

A signal Sr2 having a second reference frequency fr2 is supplied from a terminal 60 of the second PLL 59 to one input of a phase comparator 61. The reference frequency fr2 is set to a frequency higher than the first reference frequency fr1 by the minimum increment or frequency step $\Delta f$, that is fr2=fr1+$\Delta f$. A signal from a frequency divider 62 having a frequency dividing ratio of N2 is supplied to the other input of the phase comparator 61. The phases of the signal Sr2 and of the signal from the frequency divider 62 are compared by the phase comparator 61 which provides an error voltage Ver2 proportional to the frequency and/or phase differences therebetween. The error voltage Ver2 is supplied to a VCO 64 through a low-pass filter 63. A signal Sv2 having a frequency fv2 is obtained from the VCO 64, with fv2=n2×fr2. The signal Sv2 is supplied from the VCO 64 to the mixer 58 and to the frequency divider 62. The signal Sv2 is frequency divided by the frequency dividing ratio N2 in the frequency divider 62 to provide the divided signal supplied to the phase comparator 61. In an example of the frequency synthesizer of FIG. 1, fr1=25 kHz, $\Delta f$=10 Hz, and fr2=25.01 kHz.

The output signal Sv1 and the signal Sv2 are frequency converted by the mixer 58 to provide a signal Sm having a frequency fm equal to the difference between the frequencies fv1 and fv2 and which is supplied to the frequency divider 54 through a low-pass filter 65 of the PLL 51. The signal Sm is frequency divided by the frequency dividing ratio N1 in the frequency divider 54 so as to provide the frequency divided signal supplied to the phase comparator 53. As shown in FIG. 2, the frequency fv1 of the output signal Sv1 of the frequency synthesizer of FIG. 1 may be changed-over sub-ranges thereof, for example, from f0 to f1 and from f1 to f2, each having a width equal to the reference frequency fr1, with such changes in the frequency fv1 being effected in the frequency increments or steps $\Delta f$ over the sub-range or intervals between f0 and f1 and between f1 and f2.

The frequency fv1 of the output signal Sv1 of the frequency synthesizer is expressed by the following equation:

$$\begin{aligned} fv1 &= fv2 - fm \\ &= (N2 \times fr2) - (N1 \times fr1) \\ &= N2 \times (fr1 + \Delta f) - (N1 \times fr1) \\ &= fr1 \times (N2 - N1) + (\Delta f \times N2) \end{aligned}$$

If the frequency dividing ratios N1 and N2 are each increased by +1, the frequency fv1 of the output signal Sv1 is changed by only the minimum frequency step $\Delta f$. Therefore, for changing the frequency fv1 of the output signal Sv1 by the amount of the reference frequency fr1, the range of variation of the oscillating frequency of the VCO 64 needs to be (n×fr1), in which (n=fr1/$\Delta f$), that is, n is the number of frequency steps $\Delta f$ in the reference frequency fr1. Therefore, $$n \times fr2 = (fr1/\Delta f) \times fr2$$

In the example given above, that is, fr1=25 kHz, $\Delta f$=10 Hz, and fr2=25.01 kHz, the range of variation of the oscillating frequency fv2 of the VCO 64 is calculated as follows:

$$\begin{aligned} (fr1/\Delta f) \times fr2 &= (25 \times 10^3/10) \times 25.01 \times 10^3 \\ &= 62.525 \times 10^6 \text{ (Hz)} \\ &= 62.525 \text{ (MHz)} \end{aligned}$$

As earlier mentioned, as the resolution of the frequency synthesizer is increased, that is, as $\Delta f$ is decreased, the necessary range of variation of the oscillating frequency of the VCO 54 increases undesirably. Further, when the range of variation of the oscillating frequency of the VCO 64 increases, it is difficult to produce such VCO and the carrier to noise ratio C/N deteriorates. Further, as shown in FIG. 2, the frequency fv2 of the signal Sv2 changes over sub-ranges each equal in width to the reference frequency fr1 and, at the frequencies f1 and f2, such frequency fv2 suddenly decreases or drops as the output frequency fv1 is further increased. During such sudden drops in the frequency fv2, muting must be executed to suppress the noises which are generated due to the transient characteristics of the PLL.

OBJECTS AND SUMMARY OF THE INVENTION

Accordingly, it is an object of the present invention to provide a frequency synthesizer with first and second PLLs in which the range of variation of the output frequency of a voltage controlled oscillator included in the second PLL can be reduced while maintaining a high resolution and either avoiding the need for muting or substantially reducing the duration thereof.

Another object of the present invention is to provide a frequency synthesizer receiver having a local oscillator with first and second PLLs, as aforesaid.

In accordance with an aspect of the present invention, there are provided, in a frequency synthesizer in which a first PLL and a second PLL are coupled by a mixer to provide an output signal which changes in predetermined frequency steps or increments, means for establishing a first frequency change mode in which output signal frequencies of the first and second PLLs change in the same direction, means for establishing a second frequency change mode in which the output signal frequencies of the first and second PLLs change in opposite directions, and means for selecting one of the first and second frequency change modes on the basis of a frequency dividing ratio employed in one of the first and second PLLs.

In accordance with another aspect of the present invention, there are provided, in a frequency synthesizer in which a first PLL and a second PLL are coupled by a mixer and an output signal is derived which changes in predetermined frequency steps, signal generating means for generating a first reference signal and a second reference signal of a frequency which is higher than that of the first reference signal by a minimum frequency step, switching means inserted between the signal generating means and the first and second PLLs and having a first state in which the first and second reference signals are applied to the first and second PLLs, respectively, and a second state in which the second and first reference signals are applied to the first and second PLLs, respectively, first and second frequency dividing means in the first and second PLLs, respectively, and employing first and second frequency dividing ratios, respectively, and control means responsive to one of the first and second frequency dividing ratios for selectively establishing the first and second states of said switching means.

The above, and other, objects, features and advantages of the present invention, will become readily apparent from the following detailed description thereof which is to be read in connection with the accompanying drawings in which the same or corresponding parts are identified by the same reference numerals in the several views.

DETAILED DESCRIPTION OF A PREFERRED EMBODIMENT

An embodiment of the present invention will now be described in detail with reference to FIGS. 3 to 5, in which the invention is shown applied to an apparatus for receiving a short wave, FM or other broadcast signal.

Figure 1:
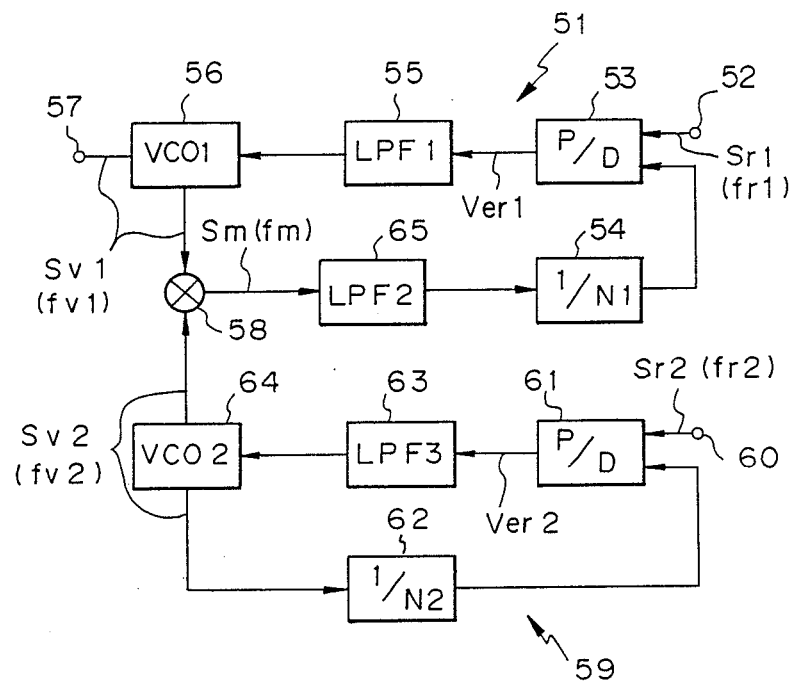
FIG. 1 is a block diagram of a frequency synthesizer according to the prior art.
Figure 2:
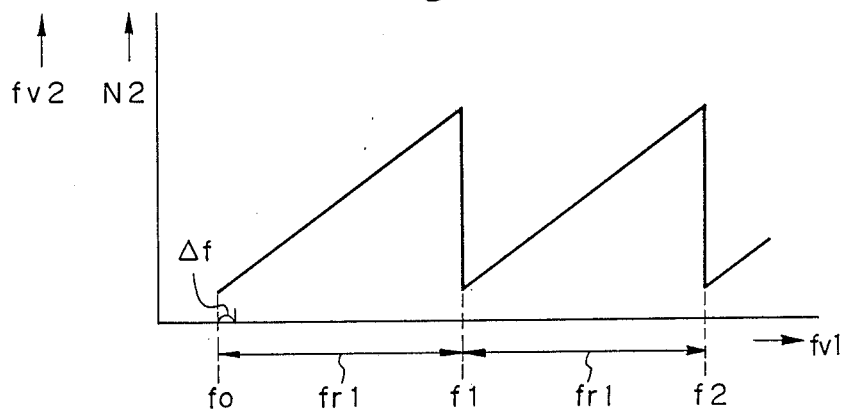
FIG. 2 is an explanatory diagram showing the relation between the frequency of an output signal and the frequency dividing ratio of one of the PLLs included in the frequency synthesizer of FIG. 1.
Figure 3:
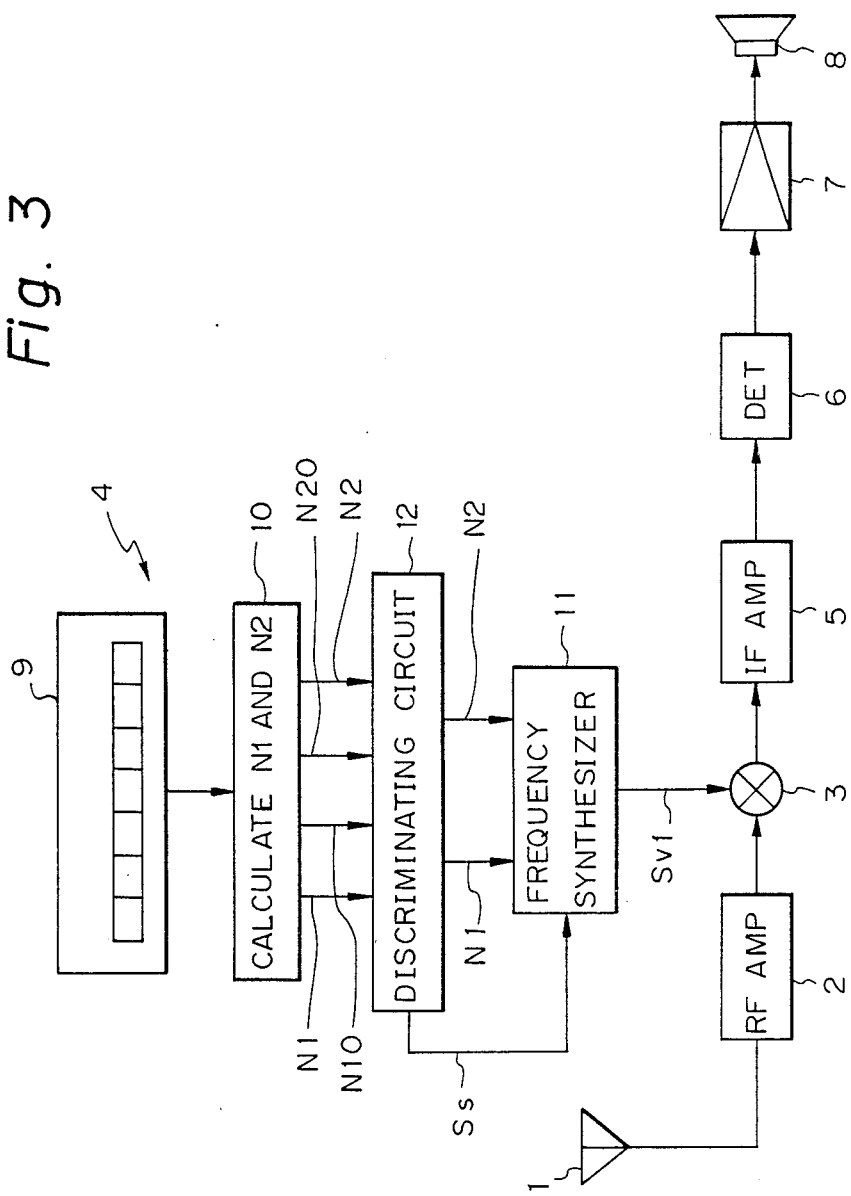
FIG. 3 is a block diagram of a broadcast receiver including a frequency synthesizer according to an embodiment of the present invention.

In the receiving apparatus of FIG. 3, a radio frequency signal is received by an antenna 1 and supplied therefrom through an RF amplifier 2 to a mixer 3. A local oscillating signal provided by a local oscillating circuit 4 is also supplied to the mixer 3. An intermediate frequency (IF) signal is formed by the mixer 3 and supplied through an IF amplifier 5 to a detecting circuit 6. An audio signal of a low frequency is detected from the intermediate frequency signal by the detecting circuit 6 and supplied to a low frequency amplifier 7. The resulting amplified audio signal is applied to a speaker 8 and output therefrom as an audio sound.

The local oscillating signal supplied to the mixer 3 is formed by the circuit 4 as follows: First, a channel to be received is selected by a station selecting device 9 of the push button type having a tuning circuit, and a binary code signal corresponding to the frequency of the selected channel is supplied from the device 9 to a calculating circuit 10. The calculating circuit 10 provides frequency dividing ratios N1, N10, N2 and N20 for determining the frequency of the local oscillating signal produced by a frequency synthesizer 11 in accordance with an embodiment of the present invention. The frequency dividing ratios N1, N10, N2 and N20 are supplied from the calculating circuit 10 to a discriminating circuit 12 and are there compared with a frequency dividing ratio corresponding to a preset limit value. Only the frequency dividing ratios N1 and N2 which do not exceed such a preset frequency dividing ratio are supplied to the frequency synthesizer 11. A switch control signal Ss for controlling switches, which will be hereinafter explained, is also supplied from the discriminating circuit 12 and is applied to the frequency synthesizer 11.

Figure 4:
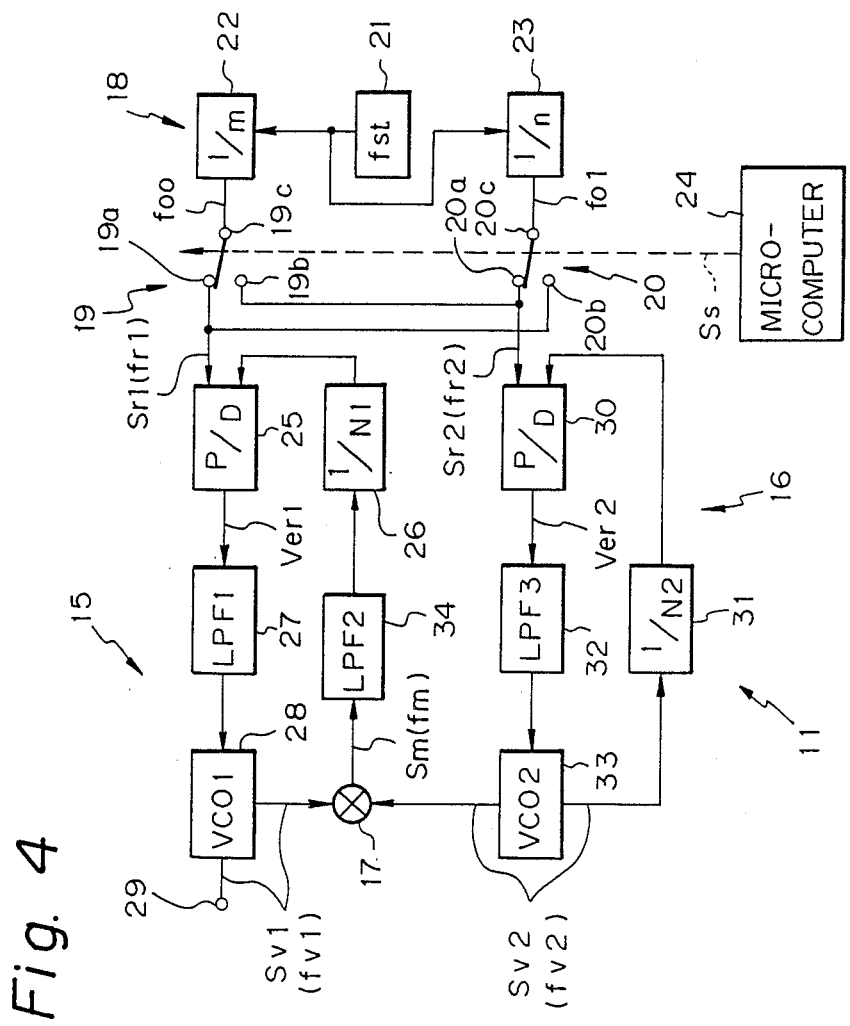
FIG. 4 is a block diagram of the frequency synthesizer included in the receiver of FIG. 3.

Referring now to FIG. 4, it will be seen that the frequency synthesizer 11 may generally comprise first and second PLLs 15 and 16, a mixer 17, a reference frequency signal forming circuit 18, and ganged switches 19 and 20.

As shown in FIG. 4, the reference frequency signal forming circuit 18 may include a reference oscillator 21 providing a signal having the frequency $f_{st}$ which is frequency divided by a frequency dividing ratio m in a frequency divider 22 so that a signal of the frequency f00 is formed. The signal of frequency $f_{st}$ is also frequency divided by a frequency dividing ratio n in a frequency divider 23 so that a signal of the frequency f01 is formed.

The signal of the frequency f00 is supplied to a terminal 19C of the switch 19, and the signal of the frequency f01 is supplied to a terminal 20C of the switch 20. The frequency f01 is set to be higher than the frequency f00 by the minimum frequency step $\Delta f$, that is f01=f00+$\Delta f$. Here again, by way of example, f00=25 kHz, $\Delta f$=10 Hz, and f01=25.01 kHz. The ganged switches 19 and 20 are changed-over by the switch control signal Ss which, for example, may be supplied from a microcomputer 24 included in the discriminating circuit 12 of FIG. 3.

When the switches 19 and 20 are conditioned as shown in FIG. 4, the signal of the frequency f00 is supplied as a signal Sr1 of the first reference frequency fr1 to one input of a phase comparator 25 of the first PLL 15 through engaged terminals 19a and 19C of the switch 19. Simultaneously, a signal from a frequency divider 26 having a frequency dividing ratio N1 is supplied to another input of the phase comparator 25. The phases of the signal Sr1 having the reference frequency fr1 and the signal from the frequency divider 26 are compared by the phase comparator 25 and the resulting error voltage Ver1, which is proportional to the frequency and/or phase difference, is supplied to a VCO 28 through a low-pass filter 27. An output signal Sv1 having the frequency fv1 is obtained from the VCO 28 and is supplied therefrom to a terminal 29 and to the mixer 17.

Further, with the switches 19 and 20 conditioned as shown on FIG. 4, the signal having the frequency f01 is supplied as a signal Sr2 of the second reference frequency fr2 to an input of a phase comparator 30 of the PLL 16 through engaged terminals 20a and 20C of the switch 20. Simultaneously, a signal from a frequency divider 31 having a frequency dividing ratio N2 is supplied to another input of the phase comparator 30. The phases of the signal Sr2 and of the signal from the frequency divider 31 are compared by the phase comparator 30 and the resulting error voltage Ver2, which is proportional to the frequency and/or phase difference, is supplied to a VCO 33 through a low-pass filter 32. A signal Sv2 having the frequency fv2 is obtained from the VCO 33. The frequency fv2 of the signal Sv2 is equal to (N2×fr2). The signal Sv2 is supplied from the VCO 33 to the mixer 17 and to the frequency divider 31. The signal Sv2 is frequency divided by the frequency dividing ratio N2 of the frequency divider 31, and the resulting output is supplied to the phase comparator 30 as mentioned above.

The output signal Sv1 and the signal Sv2 are frequency converted by the mixer 17. The resulting output signal Sm from the mixer 17 has the differential frequency fm=(fv2−fv1) and is supplied to the PLL 15. More particularly, the signal Sm is supplied through a low-pass filter 34 to the frequency divider 26 and is there frequency divided by the frequency dividing ratio N1. Thereafter, the frequency divided signal is supplied to the phase comparator 25.

The switches 19 and 20 are further shown to have terminals 19b and 20b, respectively, which are connected to the phase comparators 30 and 25, respectively.

The frequency fv1 of the output signal Sv1 from the frequency synthesizer 11 is determined from the following equations (1) and (2) for connecting states or conditions of the switches 19 and 20 hereinafter referred to as connecting states (A) and (B):

In the case of the connecting state A, in which the switch 19 has its terminals 19a and 19C connected or engaged and the switch 20 has its terminals 20a and 20C connected so that the signal of the frequency f00 is supplied as the reference signal Sr1 to the phase comparator 25 and the signal of the frequency f01 is supplied as the reference signal Sv2 to the phase comparator 30:

$$\begin{align} fv1 &= fv2 - fm \tag{1} \\ &= (N2 \times f01) - (N1 \times f00) \\ &= N2 \times (f00 + \Delta f) - (N1 \times f00) \\ &= f00 \times (N2 - N1) + (\Delta f \times N2) \end{align}$$

In the case of the connecting state B in which the switch 19 has its terminals 19b and 19C connected or engaged and the switch 20 has its terminals 20b and 20C connected so that the signal having the frequency f00 is supplied as the reference signal Sr2 to the phase comparator 30 and the signal having the frequency f01 is supplied as the reference signal Sr1 to the phase comparator 25:

$$\begin{align} fv1 &= fv2 - fm \tag{2} \\ &= (N2 \times f00) - (N1 \times f01) \\ &= (N2 \times f00) - [N1 \times (f00 + \Delta f)] \\ &= f00 \times (N2 - N1) - (\Delta f \times N1) \end{align}$$

If the frequency dividing ratios N1 and N2 of the frequency synthesizer 11 having first and second PLLs in accordance with the present invention, as described above, are each increased by +1 in the case of the connecting state A [equation (1)], and by −b1 (that is, each decreased by 1) in the case of the connecting state B [equation (2)], respectively, the frequency fv1 can be changed by the minimum frequency step Δf as follows:

In the case of the connecting state A, from equation (1)

$$fv1 = f00 \times (N2 + 1 - N1 - 1) + \Delta f \times (N2 + 1)$$

$$= f00 \times (N2 - N1) + (\Delta f \times N2) + \Delta f.$$

In the case of the connecting state B, from equation (2), $$fv1 = f00 \times (N2 - 1 - N1 + 1) - \Delta f \times (N1 - 1)$$

$$= f00 \times (N2 - N1) - (\Delta f \times N1) + \Delta f.$$

The operation of the circuit shown on FIG. 3 will now be described in detail. When a channel to be received is selected by suitable actuation of the station selecting device 9 of the push button type, the binary code signal corresponding to the frequency of the selected channel is supplied to the calculating circuit 10. The calculating circuit 10 readily responds to such binary code signal for providing the frequency dividing ratios N1, N10, N2, and N20 needed by the frequency synthesizer 11 to form the local oscillating signal. The frequency dividing ratios N1, N20, N2, and N20 are set to the values which satisfy equations (1) and (2). The frequency dividing ratios N1, N10, N2, and N20 are supplied to the discriminating circuit 12 and there compared with the predetermined frequency dividing ratio corresponding to the preset limit value. Only the frequency dividing ratios N1 and N2 which do not exceed such predetermined frequency dividing ratio are supplied to the frequency synthesizer 11.

The relations among the frequency fv1 of the output signal Sv1 from the frequency synthesizer 11, the frequency fv2 of the signal Sv2, and the frequency dividing ratios N1 and N2 will now be described with reference to an example shown on FIG. 5, and in which a solid line F1 shows changes in the frequency dividing ratios N! and N2 and the frequencies fv1 and fv2 in accordance with equation (1). Further, in FIG. 5, a dot-dash line F2 indicates changes in the frequency dividing ratios N1 and N2 and the frequencies fv1 and fv2 in accordance with equation (2).

In the illustrated example, the frequency fv1 of the output signal Sv1 is shown to vary within the frequency range from 62.062420 MHz to 62.087430 MHz. In the diagram of FIG. 5, the point P1 indicates the lower limit of the considered frequency range at which the frequency fv1=62.062420 MHz and the frequency fv2=93.587420 MHz. The frequency dividing ratios N1 and N2 at point P1 are set to N1=1259, 1261, and N2=3742. Point P2 indicates the center of the considered frequency range at which frequency fv1=62.074920 MHz and fv2=142.84992 MHZ. The frequency dividing ratios N1 and N2 at the point P2 are set to N1=2511 and N2=4992. The point P2 indicates the cross-over point between the solid line F1 and the dot-dash line F2 which represent the equations (1) and (2), respectively. The frequency dividing ratio N2 at point P2 is the value (4992) which, for example, corresponds to the previously mentioned limit value. At point P20, (N2=4991, N1=2507). Point 3 indicates an upper limit of the frequency range considered in the embodiment of FIG. 5 and at which the frequency fv1=62.087430 MHz. The frequency dividing ratios N1 and N2 at point P3 are set to N1=1258 and N2=3742. Point P4 represents a state that would be encountered in accordance with the prior art, and in which the frequency fv1 is 62.087430 MHz and the frequency fv2 of the signal Sv2 is 156.112420 MHz. The frequency dividing ratios N1 and N2 for point P4 are N2=6242 and N1=3761.

Figure 5:
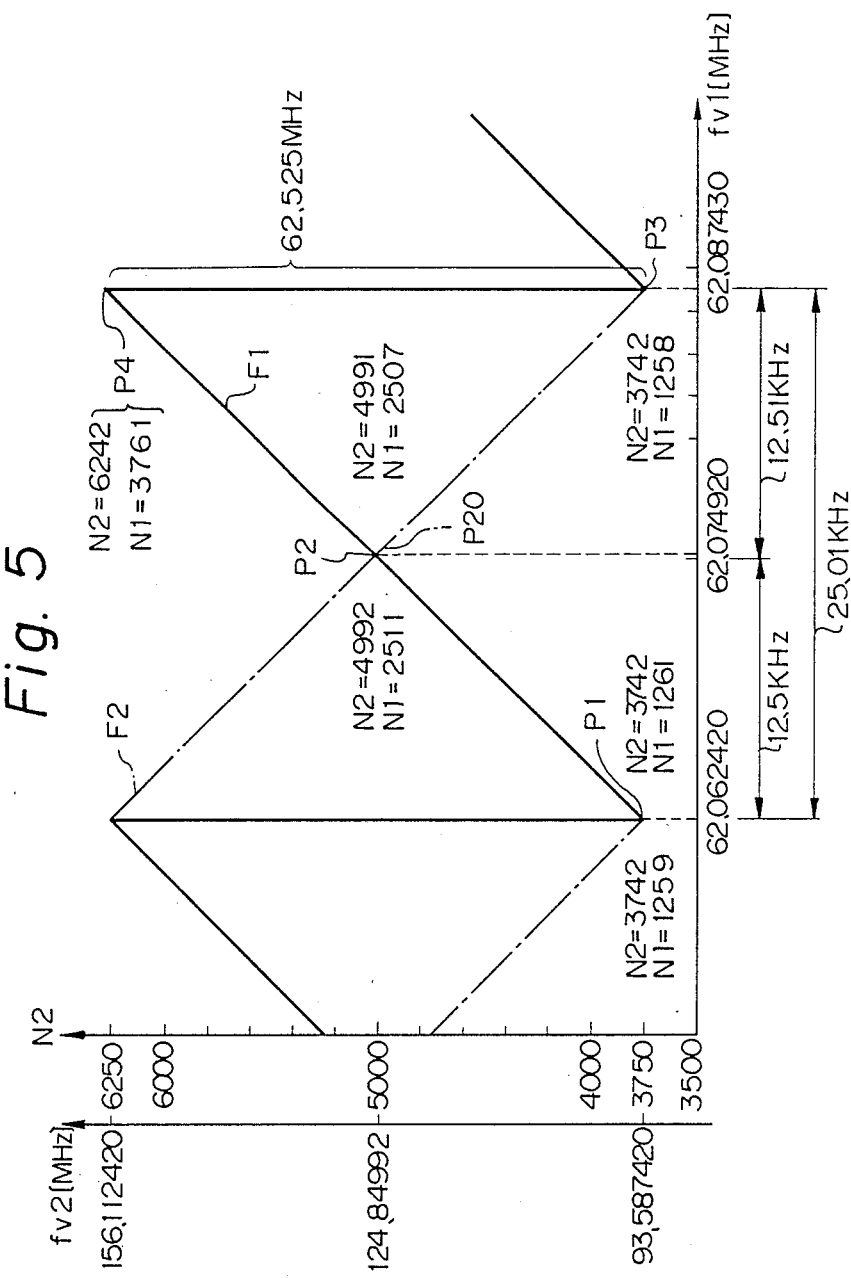
FIG. 5 is an explanatory diagram showing the relation between the frequency of an output signal and the frequency dividing ratio of one of the PLLs included in the frequency synthesizer of FIG. 4.

(1) The stage from point P1 to point P2 on FIG. 5.

At this stage, the value of the frequency dividing ratio N2 increases in accordance with equation (1) represented by the solid line F1 and the frequency fv2 of the signal Sv2 also increases. So long as the value of the frequency dividing ratio N2 is less than 4992, the switches 19 and 20 are maintained in the connecting state A shown on FIG. 4 by the switch control signal Ss. Thus, the signal of the frequency f00 is supplied to the PLL 15, and the signal of the frequency f01 is supplied to the PLL 16. As mentioned above, by increasing each of the frequency dividing ratios N1 and N2 by +1, with the switches 19 and 20 in the connecting state A, the frequency fv1 of the output signal Sv1 gradually changes by the minimum frequency step Δf. By repeating the above operation, the oscillating frequency fv2 of the VCO 33 continuously rises from 93.587420 MHz at point P1 to 124.84992 at point P2, as indicated by the solid line F1. (2) The stage from point P2 beyond point P20 to point P3

In this stage, when the value of the frequency dividing ratio N2 exceeds the value 4992 beyond the point P2 along the solid line F1, the switches 19 and 20 are changed-over by the switch control signal Ss to the connecting state B for which equation (2) represented by the dot-dash line F2 on FIG. 5 is applicable. Thus, the signal of the frequency f00 is supplied to the PLL 16, and the signal of the frequency f01 is supplied to the PLL 15. As described above, by decreasing each of the frequency dividing ratios N1 and N2 by 1, in the case of the connecting state B, the frequency fv1 of the output signal Sv1 is increased by the minimum frequency step Δf. By repeating the above operation, the frequency fv1 is gradually increased by the steps or increments Δf which the oscillating frequency fv2 of the VCO 33 of the PLL 16 gradually decreases as indicated by the dot-dash line F2 beyond the point P2.

It will be appreciated that, if the frequency fv1 is to be made variable in a range from 62.062420 MHz to 62.087430 MHz with minimum frequency steps Δf, by means of the conventional technique, the oscillating frequency of the VCO 33 must be increased along the solid line F1 from point P1 through point P2 to point P4 and the corresponding range of variation of the oscillating frequency of the VCO 33 needs to be 62.525 MHz. In other words, the frequency dividing ratio N2 needs to vary from 3742 to 6242, and the frequency fv2 needs to vary from 93.587420 MHz to 156.112420 MHz.

As distinguished therefrom, in accordance with the described embodiment of the present invention, the oscillating frequency fv2 of the VCO 33 changes in accordance with the solid line F1 on FIG. 5 extending from the point P1 to the point P2 and then in accordance with the dot-dash line F2 from the point P2 to the point P3, so that the range of variation of the frequency fv2 of the VCO 33 is only 31.2625 MHz, that is, from 93.587420 MHz to 124.84992 MHZ. Further, such reduced range of variation of the frequency fv2 corresponds to a reduced range of variation of the frequency dividing ratio N2 to from 3742 to 4992. Therefore, the required variation of the output frequency of the VCO 33 is only about ½ of that required with the conventional frequency synthesizer having two PLLs. Thus, the range of the required frequency change of the VCO 33 can be reduced while maintaining a high resolution. By reason of the foregoing, the construction of the VCO 33 can be simplified and the deterioration of the carrier to noise ratio (C/N) can be prevented. On the other hand, since the oscillating frequency of the VCO 33 of the PLL 16 changes gradually, the generation of noises can be prevented and the duration of muting, if any, can be made as short as possible.

Having described a specific preferred embodiment of the present invention with reference to the accompanying drawings, it is to be understood that the invention is not limited to that precise embodiment, and that various changes and modifications may be effected therein by one skilled in the art without departing from the scope or spirit of the invention as defined in the appended claims.

What is claimed is:

1. In a frequency synthesizer having first and second phase locked loops each including variable frequency oscillating means and frequency dividing means having a variable frequency dividing ratio, mixing means receiving outputs of the variable frequency oscillating means in said first and second phase locked loops, respectively, and means for deriving an output signal whose frequency is variable in predetermined frequency steps; the combination of:
   means for establishing a first frequency change mode in which frequencies of said outputs of said variable frequency oscillating means in said first and second phase locked loops, respectively, change in the same direction;
   means for establishing a second frequency change mode in which said frequencies of the outputs of said variable frequency oscillating means in said first and second phase locked loops, respectively, change in opposite directions; and
   control means responsive to said frequency dividing ratio of said frequency dividing means in one of said first and second phase locked loops for selecting one of said first and second frequency change modes.

2. A frequency synthesizer according to claim 1; in which said frequency of the output signal is variable in a predetermined range of frequencies, and said control means changes over between said first and second frequency change modes when said frequency of the output signal is approximately at the middle of said predetermined range of frequencies.

3. A frequency synthesizer according to claim 1; in which said output signal is derived from said variable frequency oscillating means of said first phase locked loop, said control means is responsive to said frequency dividing ratio of the frequency dividing means in said second phase locked loop, and said control means selects said first frequency change mode so long as said frequency dividing ratio in said second phase locked loop is less than a predetermined value and changes-over to select said second frequency change mode when said frequency dividing ratio in said second phase locked loop exceeds said predetermined value.

4. A frequency synthesizer according to claim 3; in which said frequency of the output signal is variable in a predetermined range of frequencies, and said predetermined value of the frequency dividing ratio in said second phase locked loop corresponds substantially to a frequency of said output signal at approximately the middle of said predetermined range of frequencies.

5. A frequency synthesizer according to claim 4; in which each of said first and second phase locked loops further includes phase comparing means, said phase comparing means of the first phase locked loop controls the respective variable frequency oscillating means on the basis of a comparison of an output of said mixing means, as frequency divided by the respective frequency dividing means, with a first reference signal, and said phase comparing means of the second phase locked loop controls the respective variable frequency oscillating means on the basis of a comparison of said output of said respective variable frequency oscillating means, as frequency divided by the respective frequency dividing means, with a second reference signal having a frequency which differs from the frequency of said first reference signal by said predetermined frequency step.

6. A frequency synthesizer according to claim 5; in which said control means includes reference signal generating means for providing said first and second reference signals, and means for establishing first and second states of said control means corresponding to said first and second frequency change modes, with said second reference signal being of a higher frequency than said first reference signal in said first state and said first reference signal being of a higher frequency than said second reference signal in said second state.

7. A frequency synthesizer according to claim 6; in which said reference signal generating means includes first and second oscillating signal sources which provide a first oscillating signal and a second oscillating signal of a frequency higher than that of said first oscillating signal by said frequency step, and said means for establishing said first and second states of the control means includes switch means which, in said first state, supplies said first and second oscillating signals as said first and second reference signals, respectively, and in said second state, supplies said second and first oscillating signals as said first and second reference signals, respectively.

8. In a frequency synthesizer including a first phase locked loop having a first comparator, a first variable oscillator and a first frequency divider, a second phase locked loop having a second comparator, a second variable oscillator and a second frequency divider, a mixer receiving outputs of said first and second variable oscillators and providing an output to said first frequency divider, said first comparator comparing a first reference signal with an output of said first frequency divider and correspondingly controlling said first variable oscillator, and said second comparator comparing a second reference signal with an output of said second frequency divider which also receives the output of said second variable oscillator, and means for deriving an output signal whose frequency is variable in predetermined steps in response to changes in frequency dividing ratios of said first and second frequency dividers; the combination of:

means for establishing a first frequency change mode in which frequencies of said outputs of the first and second variable oscillators, respectively, change in the same direction;

means for establishing a second frequency change mode in which said frequencies of the outputs of said first and second variable oscillators, respectively, change in opposite directions; and control means responsive to said frequency dividing ratio of one of said frequency dividers for selecting one of said first and second frequency change modes.

9. A frequency synthesizer according to claim 8; further comprising station selecting means actuable for determining the frequency dividing ratios of said first and second frequency dividers.

10. A frequency synthesizer according to claim 8; in which said output of said first variable oscillator also constitutes said output signal whose frequency is variable in said predetermined steps to provide a local oscillating signal.

11. A frequency synthesizer according to claim 10; in which said frequency of the output signal is variable in a predetermined range of frequencies, and said control means changes over between said first and second frequency change modes when said frequency of the output signal is approximately at the middle of said predetermined range of frequencies.

12. A frequency synthesizer according to claim 10; in which said control means is responsive to said frequency dividing ratio of said second frequency divider, and said control means selects said first frequency change mode so long as said frequency dividing ratio in said second frequency divider is less than a predetermined value and changes-over to select said second frequency change mode when said frequency dividing ratio in said second frequency divider exceeds said predetermined value.

13. A frequency synthesizer according to claim 12; in which said control means includes reference signal generating means for providing said first and second reference signals, and means for establishing first and second states of said control means corresponding to said first and second frequency change modes, with said second reference signal being of a higher frequency than said first reference signal in said first state and said first reference signal being of a higher frequency than said second reference signal in said second state.

14. A frequency synthesizer according to claim 13; in which said reference signal generating means includes first and second oscillating signal sources which provide a first oscillating signal and a second oscillating signal of a frequency higher than that of said first oscillating signal by said frequency step, and said means for establishing said first and second states of the control means includes switch means which, in said first state, supplies said first and second oscillating signals as said first and second reference signals, respectively, and in said second state, supplies said second and first oscillating signals as said first and second reference signals, respectively.

* * * * *